(12) United States Patent
Park et al.

(10) Patent No.: US 11,521,696 B2
(45) Date of Patent: Dec. 6, 2022

(54) DATA INPUT CIRCUIT AND MEMORY DEVICE INCLUDING THE SAME

(71) Applicant: SK hynix Inc., Icheon-si (KR)

(72) Inventors: Young Jun Park, Icheon-si (KR); Young Jun Ku, Icheon-si (KR); Myeong Jae Park, Icheon-si (KR); Ji Hwan Park, Icheon-si (KR); Seok Woo Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 132 days.

(21) Appl. No.: 17/077,802

(22) Filed: Oct. 22, 2020

(65) Prior Publication Data
US 2021/0295938 A1    Sep. 23, 2021

(30) Foreign Application Priority Data
Mar. 17, 2020    (KR) .................... 10-2020-0032629

(51) Int. Cl.
| | |
|---|---|
| *G11C 29/00* | (2006.01) |
| *G11C 29/14* | (2006.01) |
| *G11C 29/36* | (2006.01) |
| *G11C 29/10* | (2006.01) |
| *G11C 29/12* | (2006.01) |
| *G11C 29/46* | (2006.01) |
| *G06F 11/16* | (2006.01) |
| *G06F 11/10* | (2006.01) |
| *G06F 11/26* | (2006.01) |

(52) U.S. Cl.
CPC .......... *G11C 29/14* (2013.01); *G06F 11/1004* (2013.01); *G06F 11/16* (2013.01); *G06F 11/26* (2013.01); *G11C 29/10* (2013.01); *G11C 29/12005* (2013.01); *G11C 29/36* (2013.01); *G11C 29/46* (2013.01)

(58) Field of Classification Search
CPC ... G11C 29/14; G11C 29/10; G11C 29/12005; G11C 29/36; G11C 29/46; G06F 11/1004; G06F 11/16; G06F 11/26
See application file for complete search history.

(56) References Cited

U.S. PATENT DOCUMENTS 6,658,612 B1 * 12/2003 Park ...................... G11C 29/46
                                                         714/724
9,454,422 B2    9/2016 Coteus et al.
(Continued)

FOREIGN PATENT DOCUMENTS

| KR | 100546345 B1 | 1/2006 |
|---|---|---|
| KR | 1020150025801 A | 3/2015 |

*Primary Examiner* — Christine T. Tu
(74) *Attorney, Agent, or Firm* — William Park & Associates Ltd.

(57) ABSTRACT

A memory device includes a plurality of data input pads and at least one test data input pad. The memory device also includes a plurality of data input circuits corresponding to a plurality of channels, respectively, the plurality of data input circuits suitable for transmitting respective data received through the data input pads to the corresponding channels. The memory device further includes a test control circuit suitable for selecting at least one data input circuit among the plurality of data input circuits based on test mode information and suitable for controlling the selected data input circuit to transmit set data to the corresponding channel, during a test operation.

19 Claims, 6 Drawing Sheets

(56) References Cited

U.S. PATENT DOCUMENTS

| | | |
|---|---|---|
| 9,823,956 B2 | 11/2017 | Kim et al. |
| 2014/0003170 A1* | 1/2014 | Ku .................. G01R 31/318555 |
| | | 324/538 |
| 2020/0110645 A1* | 4/2020 | Rajgopal ............. G06F 12/0246 |

* cited by examiner

DATA INPUT CIRCUIT AND MEMORY DEVICE INCLUDING THE SAME

CROSS-REFERENCE TO RELATED APPLICATIONS

The present application claims priority under 35 U.S.C. § 119(a) to Korean Patent Application No. 10-2020-0032629, filed on Mar. 17, 2020, which is incorporated herein by reference in its entirety.

BACKGROUND

1. Field

Embodiments of the present disclosure relate to a memory device, and more particularly, to a memory device that receives test data through a test data input pad.

2. Description of the Related Art

With the rapid development of semiconductor memory technology, a high level of integration and performance is demanded in packaging semiconductor memory devices. To meet this demand, researchers and the industry are developing diverse technologies related to a three-dimensional structure in which a plurality of semiconductor memory chips are vertically stacked, rather than a two-dimensional structure in which semiconductor memory chips are planarly disposed on a printed circuit board (PCB) using wires or bumps.

Also, as the operation speeds of semiconductor memory devices increase, a semiconductor memory system of a System-In-Package (SIP) form in which a memory controller, such as a Central Processing Unit (CPU) or a Graphic Processing Unit (GPU), and a semiconductor memory device are integrated into one package is widely used. Because the pads of a semiconductor memory device of the stacked structure or the SIP structure are not exposed to the outside of the semiconductor memory device, it is difficult to perform a direct test by using a pin of test equipment.

Therefore, a semiconductor memory device may be provided with an additional pad for testing. Inevitably, the number of test pads of an integrated and miniaturized semiconductor memory device may be limited, resulting in a need to develop a technology capable of testing a semiconductor memory device with a limited number of test pads.

SUMMARY

Some embodiments of the present teachings are directed to a data input circuit capable of setting and copying input data in diverse patterns, and a memory device including the data input circuit.

In accordance with an embodiment of the present disclosure, a memory device includes a plurality of data input pads and at least one test data input pad. The memory device also includes a plurality of data input circuits corresponding to a plurality of channels, respectively, the plurality of data input circuits suitable for transmitting respective data received through the data input pads to the corresponding channels. The memory device further includes a test control circuit suitable for selecting at least one data input circuit among the plurality of data input circuits based on test mode information and suitable for controlling the selected data input circuit to transmit set data to the corresponding channel, during a test operation.

In accordance with another embodiment of the present disclosure, a memory device includes at least one test data input pad. The memory device also includes a test control circuit suitable for generating a first control signal and a plurality of second control signals based on test mode information in response to a test enable signal which is activated during a test operation. The memory device further includes a plurality of data input circuits corresponding to a plurality of channels, respectively, the plurality of data input circuits suitable for transmitting set data or test data received through the at least one test data input pad to the corresponding channels in response to the first control signal and the plurality of second control signals, respectively.

In accordance with yet another embodiment of the present disclosure, a memory device includes a base die and a plurality of core dies stacked over the base die. The base die includes at least one test data input pad. The base die also includes a plurality of data input circuits suitable for copying test data received through the at least one test data input pad and suitable for transmitting the copied test data to the core dies during a test operation. The base die further includes a test control circuit suitable for selecting at least one data input circuit among the plurality of data input circuits based on test mode information and suitable for controlling the selected data input circuit to transmit set data to the core dies during the test operation.

DETAILED DESCRIPTION

Figure 1:
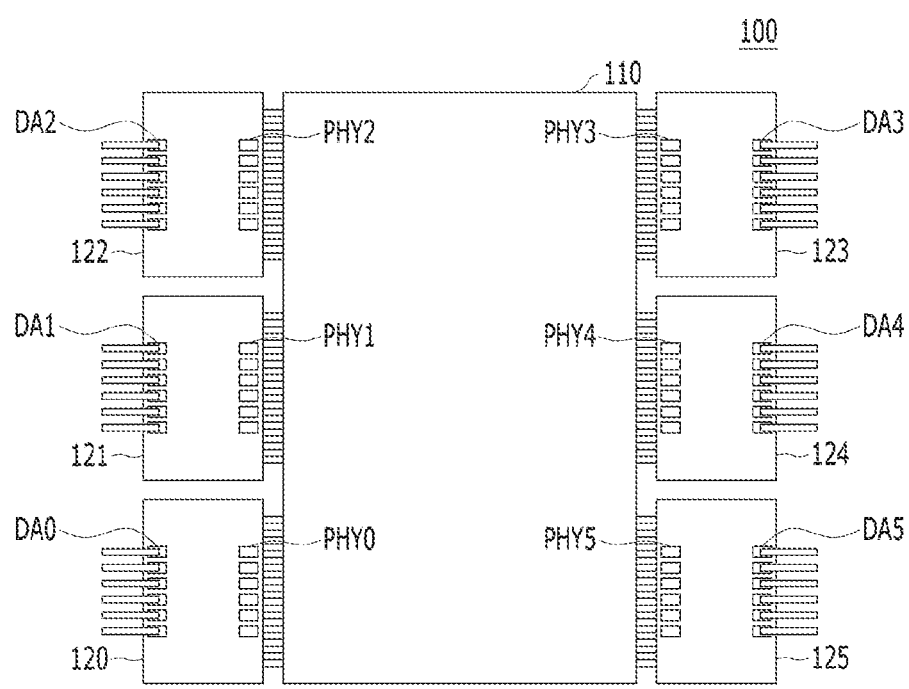
FIG. 1 is a plan view illustrating a memory system in accordance with an embodiment of the present disclosure.

Embodiments of the present teachings will be described below in detail with reference to the accompanying drawings. The present teachings may, however, be embodied in different forms and should not be construed as being limited to the embodiments set forth herein. Rather, these embodiments are provided so that this disclosure will be enabling to those skilled in the art. Throughout the disclosure, like reference numerals refer to like parts throughout the various figures and embodiments of the present teachings.

FIG. 1 is a plan view illustrating a memory system 100 in accordance with an embodiment of the present disclosure.

Referring to FIG. 1, the memory system 100 may have a System-In-Package (SIP) structure. The memory system 100 may include a controller 110 and a plurality of memory devices 120, 121, 122, 123, 124, and 125.

The controller 110 may include a Central Processing Unit (CPU), a Graphics Processing Unit (GPU), a Digital Signal Processor (DSP), an Application Processor (AP), a memory controller chip, and the like. Diverse types of processing units may be included in the controller 110 in the form of a System-On-Chip (SDC). In other words, the controller 110 may represent one chip in which diverse systems are integrated.

Each of the memory devices 120 to 125 may include a plurality of integrated circuit chips. The integrated circuit chips may be stacked on one another and electrically connected using through silicon vias (TSVs). In other words, the memory devices 120 to 125 may be formed of high bandwidth memory (HBM) in which a bandwidth is increased by increasing the number of input/output units.

However, the present teachings are not limited thereto, and the memory devices 120 to 125 are not only volatile memory devices using memory such as Dynamic Random Access Memory (DRAM), but also non-volatile memory devices, such as a flash memory device, a Phase Change Random Access Memory device (PCRAM), and a Resistive Random Access Memory device (ReRAM), a ferroelectric memory device (FeRAM), a Magnetic Random Access Memory device (MRAM), a Spin Transfer Torque Random Access Memory device (STTRAM), or the like. Alternatively, the memory devices 120 to 125 may be formed as a combination of two or more of the volatile memory devices and the non-volatile memory devices.

The controller 110 and the memory devices 120 to 125 may be stacked over an interposer. The controller 110 and the memory devices 120 to 125 may communicate with each other through a signal path formed in the interposer. For communication with the controller 110, the memory devices 120 to 125 may include PHY interfaces PHY0, PHY1, PHY2, PHY3, PHY4, and PHY5 that are coupled to the interposer through micro bumps. However, it may be difficult to test the memory devices 120 to 125 through the PHY interfaces PHY0 to PHY5 because the physical size of the micro bumps is very small and the number of the micro bumps is more than approximately 1000.

Therefore, the memory devices 120 to 125 may include a Direct Access (DA) interfaces DA0, DA1, DA2, DA3, DA4, and DA5 for directly accessing and testing the memory devices 120 to 125, respectively, from the outside of the memory devices 120 to 125. The DA interfaces DA0 to DA5 may be interfaced through the direct access pads having a relatively larger physical size and less in number than micro bumps and may be used for testing.

Figure 2:
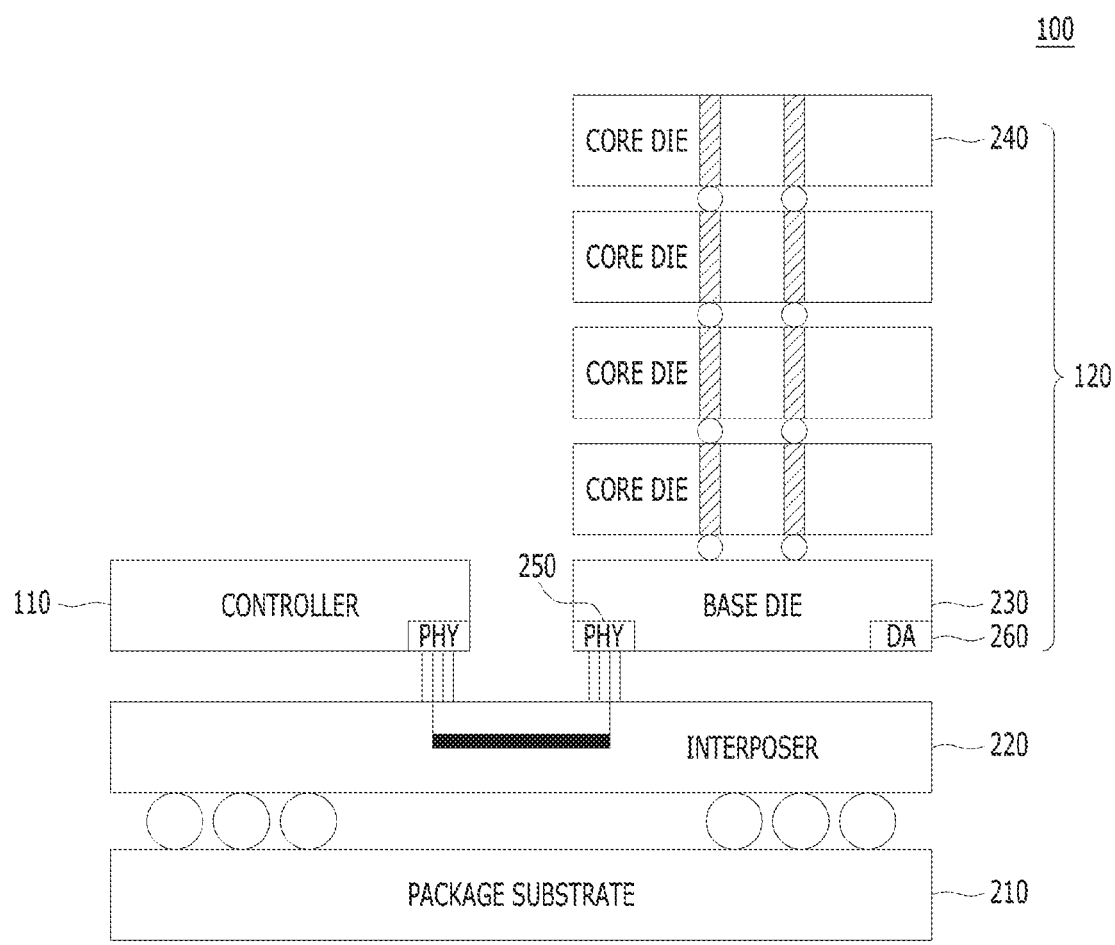
FIG. 2 is a cross-sectional view illustrating the memory system shown in FIG. 1.

FIG. 2 is a cross-sectional view illustrating the memory system 100 shown in FIG. 1.

FIG. 2 shows a structure in which the controller 110 and the first memory device 120 among the memory devices 120 to 125 are stacked. Although not illustrated in FIG. 2, the second to sixth memory devices 121 to 125 may also have a stacked structure which is similar to that of the first memory device 120.

The memory system 100 may further include a package substrate 210 and an interposer 220 which is stacked over the package substrate 210. The interposer 220 may be stacked over the package substrate 210 or coupled to the package substrate 210 through electrical connection means, such as a bump ball, a ball grid array, and the like. The controller 110 and the first memory device 120 may also be stacked over the interposer 220 and electrically connected to the interposer 220 through a micro bump.

The first memory device 120 may include a plurality of integrated circuit chips 230 and 240 that are stacked on one another. The integrated circuit chips 230 and 240 may be electrically connected to each other through micro bumps and through silicon vias (TSVs) formed vertically penetrating the inside of the integrated circuits 230 and 240 to transmit and receive signals.

The integrated circuit chips 230 and 240 may include a base die 230 and a number of core dies 240. The core dies 240 may be provided with data storage space, such as a memory cell array for storing data and a memory register. On the other hand, circuits for transmitting signals between the core dies 240 and the controller 110 may be disposed in the base die 230.

As described above, the first memory device 120 may communicate with the controller 110 through the PHY interface 250 coupled to the micro bumps. Also, the first memory device 120 may be directly accessed and tested from the outside of the first memory device 120 through the DA interface 260 formed of direct access pads. The direct access pads may be provided in a relatively larger size and be smaller in number than the micro bumps.

Figure 3:
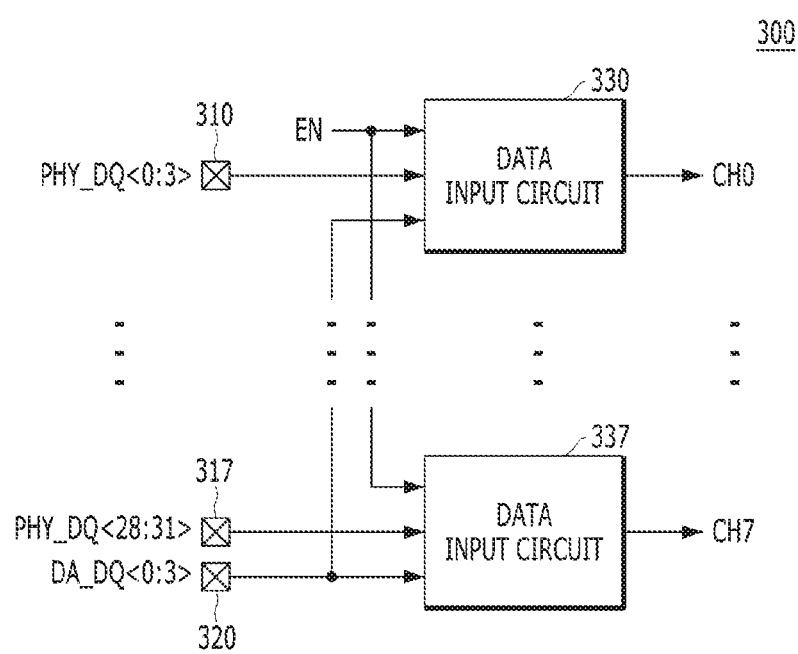
FIG. 3 is a block diagram illustrating a memory device shown in FIG. 1.

FIG. 3 is a block diagram illustrating a memory device 300 shown in FIG. 1.

FIG. 3 shows a base die of the memory device 300, and it shows a portion related to a DA interface and a PHY interface. The memory device 300 may include a plurality of data input pads 310 to 317, at least one test data input pad 320, and a plurality of data input circuits 330 to 337. The data input pads 310 to 317 may include a micro bump pad as the PHY interface. In a normal operation, data PHY_DQ<0:31> may be inputted from a host through the data input pads 310 to 317.

The at least one test data input pad 320 may include a direct access pad as a DA interface. During a test operation, test data DA_DQ<0:3> may be inputted from the outside of the memory device 300 through the at least one test data input pad 320.

The data input circuits 330 to 337 may correspond to a plurality of channels CH0 to CH7, respectively. In a normal operation, the data input circuits 330 to 337 may transmit the data PHY_DQ<0:31> received by the data input pads 310 to 317 to the corresponding channels, respectively.

Meanwhile, during a test operation, the data input circuits 330 to 337 may transmit the test data DA_DQ<0:3> received by the at least one test data input pad 320 to the corresponding channels in response to a test enable signal EN. When the test enable signal EN is activated during the test operation, the data input circuits 330 to 337 may transmit the test data DA_DQ<0:3> received by the at least one test data input pad 320 to the channels CH0 to CH7 instead of the data PHY_DQ<0:31> received by the data input pads 310 to 317.

As described above, the at least one test data input pad 320 may be relatively large in size and small in number compared to the data input pads 310 to 317. Accordingly, during the test operation, the data input circuits 330 to 337 may copy the test data DA_DQ<0:3> received through the at least one test data input pad 320 and transmit the same data to the channels CH0 to CH7.

In the test operation, the memory device 300 may transfer the test data DA_DQ<0:3> to core dies through the channels CH0 to CH7. Data transferred to the core dies may be stored in memory cells included in the core dies. Herein, the memory device 300 may perform an error correction code (ECC) operation to detect and correct errors occurring in the data stored in the memory cells.

For example, the memory device 300 may generate parity data by performing an ECC encoding operation on the test data DA_DQ<0:3>, and store a codeword formed of the test data DA_DQ<0:3> and the parity data in memory cells. The memory device 300 may perform an ECC decoding operation on the data that are read from the memory cells and detect and correct errors occurring in the data stored in the memory cells based on the parity data.

During the test operation, an ECC operation of the memory device 300 may also be tested. The memory device 300 may check whether the ECC operation is normally performed or not based on the logic level of the parity data generated through the ECC operation. However, when data of the same pattern is used by copying the test data DA_DQ<0:3>, the parity data may also be generated in a uniform pattern. Therefore, it may be difficult to accurately test the ECC operation of the memory device 300.

Figure 4:
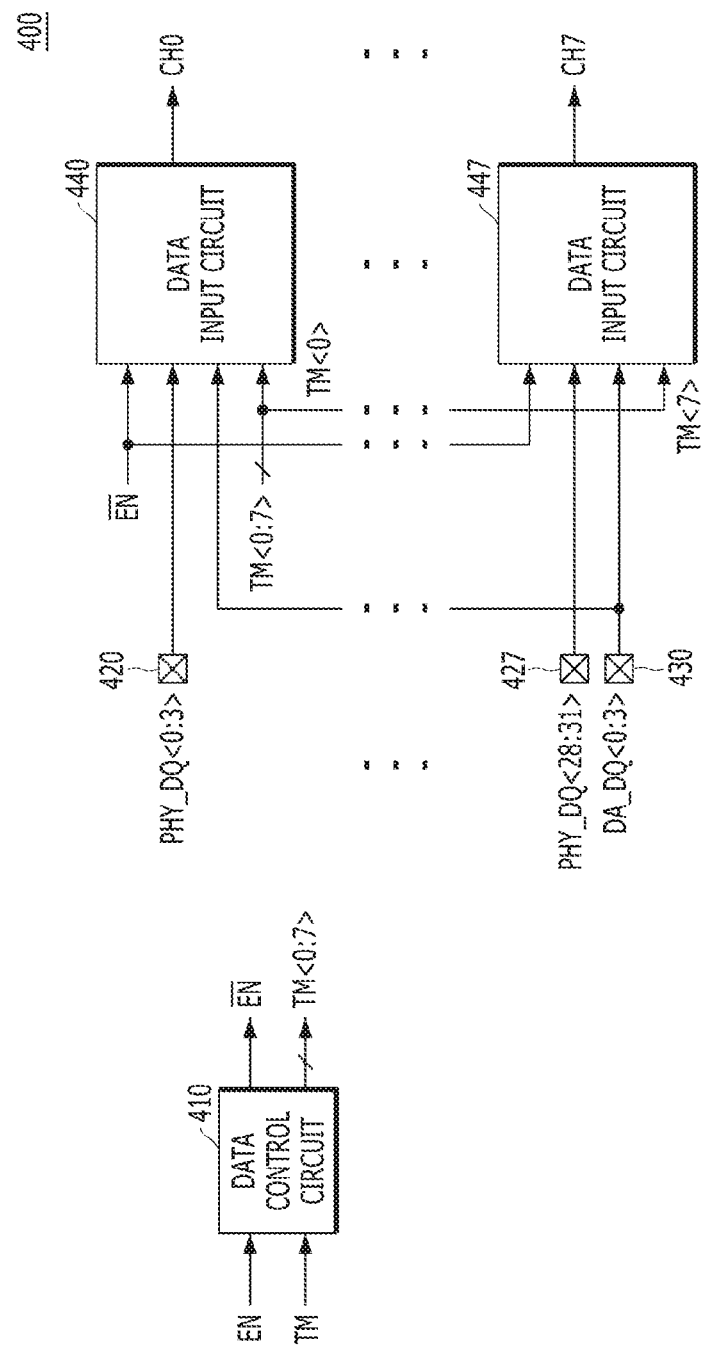
FIG. 4 is a block diagram illustrating a memory device in accordance with an embodiment of the present disclosure.

FIG. 4 is a block diagram illustrating a memory device 400 in accordance with an embodiment of the present disclosure.

FIG. 4 shows a base die of the memory device 400, and FIG. 4 shows a portion related to the DA interface and the PHY interface. The memory device 400 may include a test control circuit 410, a plurality of data input pads 420 to 427, at least one test data input pad 430, and a plurality of data input circuits 440 to 447.

The data input pads 420 to 427 may include a micro bump pad as a PHY interface. In a normal operation, data PHY_DQ<0:31> may be inputted from a host through the data input pads 420 to 427.

The at least one test data input pad 430 may include a direct access pad as a DA interface. During a test operation, test data DA_DQ<0:3> may be inputted from the outside of the memory device 400 through the at least one test data input pad 430, The data input circuits 440 to 447 may correspond to channels CH0 to CH7, respectively. In a normal operation, the data input circuits 440 to 447 may transmit the data PHY_DQ<0:31> received by the data input pads 420 to 427 to the corresponding channels, respectively.

In a test operation, the test control circuit 410 may generate a first control signal $\overline{EN}$ and a plurality of second control signals TM<0:7> based on test mode information TM in response to a test enable signal EN. Herein, the test enable signal EN may represent a signal that is activated during a test operation. The test mode information TM may be stored as a predetermined value in a mode register set, or the like, or the test mode information TM may be generated by combining addresses inputted from the outside of the memory device 400 during a test operation.

To be specific, the test control circuit 410 may generate the first control signal $\overline{EN}$ by inverting the test enable signal EN. When the test enable signal EN is activated, the test control circuit 410 may select at least one signal among the second control signals TM<0:7> according to the code value of the test mode information TM and generate the first control signal $\overline{EN}$ to have a different logic level from the logic levels of the other signals. For example, the test control circuit 410 may activate the other signals while deactivating the at least one selected signal among the second control signals TM<0:7>. As the at least one selected signal among the second control signals TM<0:7> is activated, the other signals may be deactivated, which may be realized differently according to an embodiment of the present teachings.

During a test operation, the data input circuits 440 to 447 may transmit set data or the test data DA_DQ<0:3> received through the at least one test data input pad 430 to the corresponding channels, respectively, in response to the first control signal $\overline{EN}$ and the second control signals TM<0:7>. In other words, the data input circuit corresponding to the signal selected from the second control signals TM<0:7> among the data input circuits 440 to 447 may transmit the set data to the corresponding channel. On the other hand, the data input circuits corresponding to the other signals of the second control signals TM<0:7> among the data input circuits 440 to 447 may transmit the test data DA_DQ<0:3> to the corresponding channels.

Accordingly, during a test operation, the test control circuit 410 may select at least one data input circuit among the data input circuits 440 to 447 and control the selected data input circuit to transmit the set data to the corresponding channel by using the first control signal $\overline{EN}$ and the second control signals TM<0:7>. The test control circuit 410 may control the other data input circuits among the data input circuits 440 to 447 except the selected data input circuit to transmit the test data DA_DQ<0:3> to the corresponding channels.

Figure 5:
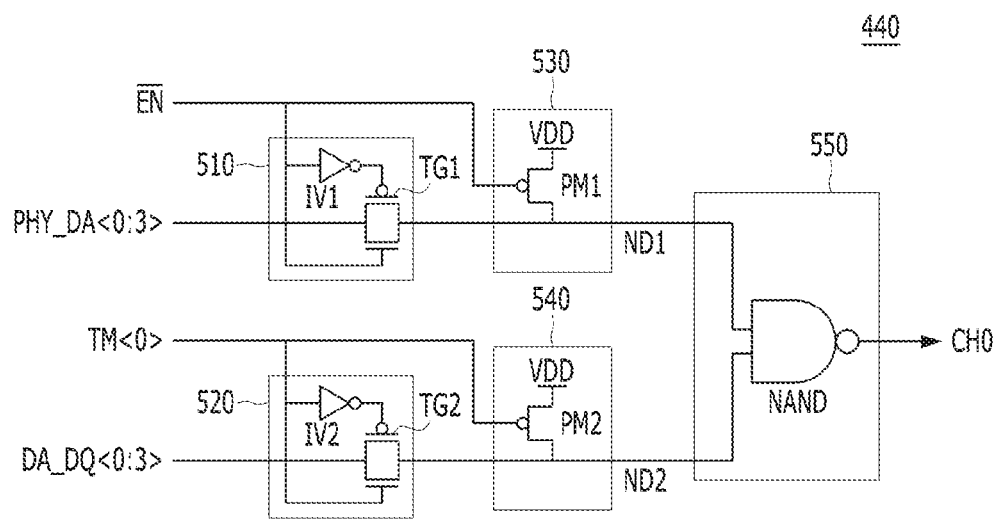
FIG. 5 is a block diagram illustrating a data input circuit shown in FIG. 4.

FIG. 5 is a block diagram illustrating the data input circuit 440 shown in FIG. 4.

The data input circuit 440 may include a first transmitter 510, a second transmitter 520, a first driver 530, a second driver 540, and a signal combining unit 550. Although FIG. 5 illustrates one among the data input circuits 440 to 447 shown in FIG. 4, all of the data input circuits 440 to 447 of FIG. 4 may have similar structures with only a difference in their input and output signals.

The first transmitter 510 may transmit the data PHY_DQ<0:3> received by the corresponding data input pad 420 among the data input pads 420 to 427 in response to the first control signal $\overline{EN}$ to a first node ND1. The first transmitter 510 may include a first inverter IV1 and a first transfer gate TG1. The first inverter IV1 may invert and output the first control signal $\overline{EN}$, and the first transfer gate TG1 may output the data PHY_DQ<0:3> to the first node ND1 in response to the first control signal $\overline{EN}$ and the output signal of the first inverter IV1.

The second transmitter 520 may transmit the test data DA_DQ<0:3> received through the at least one test data input pad 430 to the second node ND2 in response to the corresponding second control signal TM<0> among the second control signals TM<0:7>. The second transmitter 520 may include a second inverter IV2 and a second transfer gate TG2. The second inverter IV2 may invert and output the corresponding second control signal TM<0>, and the second transfer gate TG2 may output the test data DA_DQ<0:3> to the second node ND2 in response to the corresponding second control signal TM<0> and the output signal of the second inverter IV2.

The first driver 530 may drive the first node ND1 with a power supply voltage VDD level in response to the first control signal $\overline{EN}$. The first driver 530 may include a first PMOS transistor PM1 which is coupled between a power supply voltage VDD terminal and the first node ND1 to receive the first control signal $\overline{EN}$ through a gate.

The second driver 540 may drive the second node ND2 with the power supply voltage VDD level in response to the corresponding second control signal TM<0> among the second control signals TM<0:7>. The second driver 540 may include a second PMOS transistor PM2 that is coupled between the power supply voltage VDD terminal and the second node ND2 to receive the corresponding second control signal TM<0> through a gate.

The signal combining unit 550 may combine the signals of the first node ND1 and the second node ND2 so as to produce a combined signal and output the combined signal to the corresponding channel CH0. The signal combining unit 550 may include a NAND gate that receives the signals from the first node ND1 and the second node ND2 and performs a logical operation.

When the test enable signal EN is deactivated during a normal operation, the test control circuit 410 may deactivate all of the second control signals TM<0:7> while generating the first control signal $\overline{EN}$ at a logic high level. In response to the first control signal $\overline{EN}$ of the logic high level, the first transmitter 510 may transmit the data PHY_DQ<0:3> to the first node ND1 and the first driver 530 may be turned off. On the other hand, the second control signals TM<0:7> may be disabled, and the second transmitter 520 may block the transfer of the test data DA_DQ<0:3>, and the second driver 540 may drive the second node ND2 with the power supply voltage VDD level. Therefore, the signal of the second node ND2 may have a logic high level, and the signal combining unit 550 may transfer the data PHY_DQ<0:3> of the first node ND1 to the corresponding channel CH0.

During a test operation, when the test enable signal $\overline{EN}$ is activated, the test control circuit 410 may generate the first control signal $\overline{EN}$ at a logic low level. In response to the first control signal $\overline{EN}$ of the logic low level, the first transmitter 510 may block the transfer of the data PHY_DQ<0:3>, and the first driver 530 may drive the first node ND1 with the power supply voltage VDD level.

Herein, when the test control circuit 410 selects and deactivates the corresponding second control signal TM<0> among the second control signals TM<0:7>, the second transmitter 520 may block the transfer of the test data DA_DQ<0:3>, and the second driver 540 may drive the second node ND2 with the power supply voltage VDD level. Accordingly, the signals of the first node ND1 and the second node ND2 may all have a logic high level, and the signal combining unit 550 may transfer the data that are set to a logic low level to the corresponding channel CH0.

Meanwhile, when the test control circuit 410 selects another second control signal among the second control signals TM<0:7> and activates the corresponding second control signal TM<0>, the second transmitter 520 may transmit the test data DA_DQ<0:3> to the second node ND2, and the second driver 540 may be turned off. Therefore, the signal of the first node ND1 may have a logic high level, and the signal combining unit 550 may transfer the test data DA_DQ<0:3> of the second node ND2 to the corresponding channel CH0.

Figure 6:
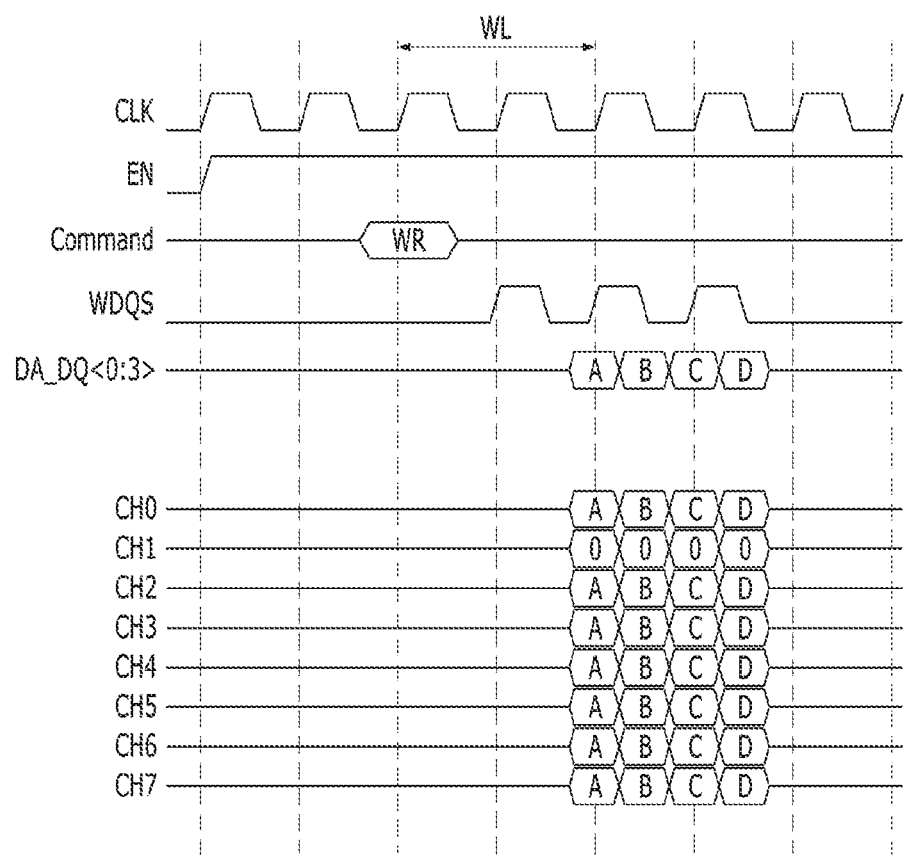
FIG. 6 is a signal waveform diagram illustrating an operation of a memory device in accordance with the embodiment of the present disclosure.

FIG. 6 is a signal waveform diagram illustrating an operation of the memory device 400 in accordance with the embodiment of the present disclosure.

When the memory device 400 enters a test mode, the test enable signal EN may be activated. Subsequently, after a write latency WL according to a write command WR directing a write operation, the memory device 400 may be synchronized with a data strobe signal WDQS to receive the test data DA_DQ<0:3> through the test data input pad 430.

The test control circuit 410 may deactivate the first control signal $\overline{EN}$ by inverting the activated test enable signal EN. Accordingly, the first transmitter of each of the data input circuits 440 to 447 may block the transfer of the data PHY_DQ<0:31>, and the first driver of each of the data input circuits 440 to 447 may drive the first node with the power supply voltage VDD level.

Herein, as illustrated as an example in FIG. 6, the test control circuit 410 may select and deactivate a second signal among the second control signals TM<0:7> according to the test mode information TM. Accordingly, among the data input circuits 440 to 447, the second transmitter of the second data input circuit may block the transfer of the test data A, B, C, and D, and the second driver of the second data input circuit may drive the second node with the power supply voltage VDD level. As a result, the second data input circuit of the data input circuits 440 to 447 may transmit data that are set to a logic low level 0 to the corresponding channel CH1.

Meanwhile, the test control circuit 410 may activate the other second control signals except the selected second control signal among the second control signals TM<0:7>. Therefore, in the other data input circuits except the second data input circuit among the data input circuits 440 to 447, the second transmitter may transmit the test data A, B, C, and D to the second node, and the second driver may be turned off. As a result, the other data input circuits except the second data input circuit among the data input circuits 440 to 447 may transmit the test data A, B, C, and D to the corresponding channels CH0 and CH2 to CH7.

The memory device 400 in accordance with the embodiment of the present disclosure may be able to mask some data based on the test mode information TM and transfer set data by copying data received by the test input pad 430 and transferring the copied data to the channels CH0 to CH7. The memory device 400 may be able to transfer data of a pattern that is set according to a test operation to the channels CH0 to CH7. Accordingly, result data according to various operations of the memory device 400 may be predicted, and the coverage of an operation that may be tested may be increased.

According to the embodiment of the present disclosure, a memory device may be tested by copying data received through a limited number of test input pads, thereby minimizing the number of the test input pads and increasing the efficiency of a test operation. Also, when the received data are copied, the copied data may be set in diverse patterns to test diverse operations of the memory device.

For example, a plurality of data input circuits that receive and copy data may be selectively disabled according to test mode information. In other words, it is possible to selectively mask some data that are copied by the data input circuits. Accordingly, the pattern of data generated by various operations of the memory device, such as an Error Correction Code (ECC) operation, etc., may also be predicted by using data of a desired pattern, thereby increasing the coverage of the test operation.

While the present teachings have been described with respect to the specific embodiments, it will be apparent to those skilled in the art that various changes and modifications may be made without departing from the spirit and scope of the present teachings as defined in the following claims.

What is claimed is:
1. A memory device, comprising:
a plurality of data input pads and at least one test data input pad;
a plurality of data input circuits corresponding to a plurality of channels, respectively, the plurality of data input circuits configured to transmit respective data received through the data input pads to the corresponding channels; and
a test control circuit configured to select at least one data input circuit among the plurality of data input circuits based on test mode information and configured to select the selected data input circuit to transmit set data to the corresponding channel, during a test operation.
2. The memory device of claim 1,
wherein during the test operation, the other data input circuits except the selected data input circuit among the plurality of data input circuits configured to transmit test data that are received through the at least one test data input pad to the corresponding channels in response to a control signal generated by the test control circuit.

3. The memory device of claim 2,
wherein the test control circuit is activated in response to a test enable signal which is activated during the test operation, and
wherein the test control circuit is configured to generate a first control signal and a plurality of second control signals as the control signal based on the test mode information.

4. The memory device of claim 3,
wherein the test control circuit is configured to generate the first control signal by inverting the test enable signal, and select at least one second control signal among the plurality of second control signals based on the test mode information to generate the selected second control signal with a different logic level from the other second control signals.

5. The memory device of claim 3, wherein each of the plurality of data input circuits includes:
a first transmitter configured to transmit data received through a corresponding data input pad among the plurality of data input pads to a first node in response to the first control signal;
a first driver configured to drive the first node with a power supply voltage level in response to the first control signal;
a second transmitter configured to transmit the test data received through the at least one test data input pad to a second node in response to a corresponding second control signal among the plurality of second control signals; and
a second driver configured to drive the second node with the power supply voltage level in response to the corresponding second control signal among the plurality of second control signals.

6. The memory device of claim 5, wherein each of the plurality of data input circuits further includes:
a logic gate configured to perform a logic operation on the signals of the first node and the second node so as to produce a resultant signal and output the resultant signal to the corresponding channel.

7. The memory device of claim 1, further comprising:
a base die including the plurality of data input pads and the at least one test data input pad; and
a plurality of core dies stacked over the base die to receive data through the channels.

8. The memory device of claim 7,
wherein the plurality of data input pads includes a micro bump pad, and
wherein the at least one test data input pad includes a direct access pad.

9. A memory device, comprising:
at least one test data input pad;
a test control circuit configured to generate a first control signal and a plurality of second control signals based on test mode information in response to a test enable signal which is activated during a test operation; and
a plurality of data input circuits corresponding to a plurality of channels, respectively, the plurality of data input circuits configured to transmit set data or test data received through the at least one test data input pad to the corresponding channels in response to the first control signal and the plurality of second control signals, respectively.

10. The memory device of claim 9,
wherein the test control circuit is configured to generate the first control signal by inverting the test enable signal, and select at least one second control signal among the plurality of second control signals based on the test mode information to generate the selected second control signal with a different logic level from the other second control signals.

11. The memory device of claim 10,
wherein at least one data input circuit among the plurality of data input circuits is configured to transmit the set data to the corresponding channel in response to the selected second control signal.

12. The memory device of claim 11,
wherein the other data input circuits except the at least one data input circuit among the plurality of data input circuits are configured to transmit the test data received through the at least one test data input pad to the corresponding channels in response to the other second control signals.

13. The memory device of claim 9, further comprising:
a plurality of data input pads,
wherein the plurality of data input circuits transmit respective data received through the data input pads to the corresponding channels.

14. The memory device of claim 13, wherein each of the plurality of data input circuits includes:
a first transmitter configured to transmit data received through a corresponding data input pad among the plurality of data input pads to a first node in response to the first control signal;
a first driver configured to drive the first node with a power supply voltage level in response to the first control signal;
a second transmitter configured to transmit the test data received through the at least one test data input pad to a second node in response to a corresponding second control signal among the plurality of second control signals; and
a second driver configured to drive the second node with the power supply voltage level in response to the corresponding second control signal among the plurality of second control signals.

15. A memory device, comprising:
a base die; and
a plurality of core dies stacked over the base die,
wherein the base die comprises:
at least one test data input pad;
a plurality of data input circuits configured to copy test data received through the at least one test data input pad and configured to transmit the copied test data to the core dies during a test operation; and
a test control circuit configured to select at least one data input circuit among the plurality of data input circuits based on test mode information and configured to control the selected data input circuit to transmit set data to the core dies during the test operation.

16. The memory device of claim 15, wherein the base die further includes:
a plurality of data input pads,
wherein the data input circuits are configured to transmit, during a normal operation, respective data received through the data input pads to the core dies, respectively.

17. The memory device of claim 16,
wherein the test control circuit is activated in response to a test enable signal which is activated during the test operation, and
wherein the test control circuit is configured to generate a first control signal and a plurality of second control signals based on the test mode information.

18. The memory device of claim 17,
wherein the test control circuit is configured to generate the first control signal by inverting the test enable signal, and select at least one second control signal among the plurality of second control signals based on the test mode information to generate the selected second control signal with a different logic level from the other second control the signals.

19. The memory device of claim 17, wherein each of the data input circuits includes:

a first transmitter configured to transmit data received through a corresponding data input pad among the plurality of data input pads to a first node in response to the first control signal;
a first driver configured to drive the first node with a power supply voltage level in response to the first control signal;
a second transmitter configured to transmit the test data received through the at least one test data input pad to a second node in response to a corresponding second control signal among the plurality of second control signals; and
a second driver configured to drive the second node with the power supply voltage level in response to the corresponding second control signal among the plurality of second control signals.

* * * * *